July 13, 1937. E. H. YONKERS, JR Re. 20,446

NEGATIVE RESISTANCE

Original Filed July 22, 1930

Inventor:
Edward H. Yonkers Jr.

By Paul Carpenter and Whitman Taylor
Attys.

Reissued July 13, 1937

Re. 20,446

UNITED STATES PATENT OFFICE 20,446

NEGATIVE RESISTANCE

Edward H. Yonkers, Jr., Chicago, Ill.

Original No. 2,002,238, dated May 21, 1935, Serial No. 469,809, July 22, 1930. Application for reissue October 18, 1935, Serial No. 45,617

7 Claims. (Cl. 250—36)

This invention relates in general to electrical circuits, particularly those of the type known as negative resistance circuits for the production of oscillating currents, the present invention employing a function of the electrons thrown off from an incandescent cathode for this purpose.

One of the objects of my invention is to provide a device having negative electrical resistance characteristics. Ordinary resistance is generally considered as positive resistance, that is, the current flowing in a positive resistance varies directly with the potential applied to it. A negative resistance, on the other hand, is one in which the current varies inversely with the applied potential.

Prior art devices known to me wherein negative resistance characteristics are present depend either upon gas ionization or upon the phenomenon known as secondary emission of electrons for their operation, as distinguished from my present invention wherein neither of these phenomena is employed, or essential to, the attainment of the functions of this device.

Negative resistance is capable of cancelling an equal positive resistance, and hence, when it is connected to a resonant circuit having positive resistance, it is capable of cancelling the positive resistance and causing sustained oscillations to occur in the resonant circuit. A device having a negative resistance characteristic of suitable value is useful as a means for generating electrical oscillations.

It is obvious from this that one of the objects of my invention is to supply a negative resistance device which may be designed to supply various negative resistance values useful in the situations mentioned above, among many others. These adjustments and regulations in accordance with my invention are calculable in advance and so may be incorporated in the finished device to meet the performance demands required. Another object of my invention is to provide a device wherein the current varies inversely with the applied potential and wherein this variation of current is attained by regulation of the velocity of flow of electrons between the various electrodes of the system. A further object of my invention is to produce a true negative resistance which may be designed to produce various values of negative resistance over a wide range and not subject to the accidental phenomena which act within a relatively limited range to produce negative resistance which cannot be wholly or satisfactorily controlled or adjusted to meet the requirements of various applications.

Further objects of this invention reside in the provision of a unitary structure capable of convenient installation in electrical circuits for producing the desired results, and for carrying out the method here involved; the provision of a system and method of producing electrical oscillations referred to wherein the various electrodes of the device are appropriately mounted in a highly evacuated container conveniently of transparent material, such as glass or the like, and provided with suitable lead-in wires capable of connection as desired in the circuit in which the device is to be used.

The foregoing and such other objects and advantages which may appear or be pointed out as this description proceeds, may be attained in a structural embodiment of the invention for carrying the method and system into effect, illustrated in the accompanying drawing wherein.

Figure 1:
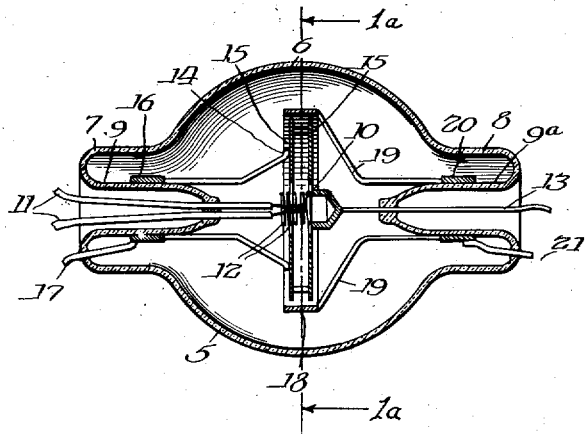
Figure 1 is a longitudinal section taken on the line 1—1 of Figure 1a and illustrates one form of the device for carrying out the invention.
Figure 1A:
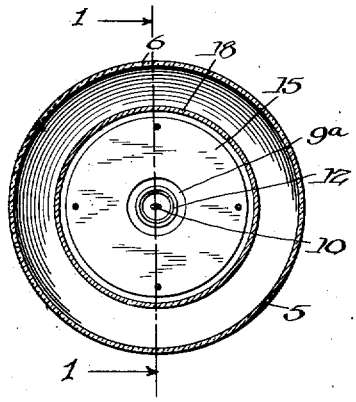
Figure 1a is a transverse section taken on the line 1a—1a of Figure 1.

Referring now more particularly to the drawing and first to Figure 1, I have illustrated a highly evacuated envelope 5, which may be formed of a transparent material, such as glass, and includes the enlarged bulb portion 6, provided with reduced ends 7 and 8, formed with inwardly directed axially aligned pedestals 9 and 9a, which serve as supporting elements for the lead-in wires and electrodes hereinafter described.

Extending through and supported by the pedestal 9 I provide a filamentary cathode 10 whose lead-in conductors 11 are connected so as to supply current for the heating of the cathode 10 to incandescence. In the structural embodiment as shown in Figure 1, for convenience I provide a grid 12, which latter is mounted preferably on the longitudinal axis of the device and is helical in form, that is, is formed of a coiled wire with the convolutions thereof slightly spaced apart. The grid is supported on its conductor wire 13, which latter extends through the pedestal 9a, and is connected in an electrical circuit as will be hereinafter described.

The cathode 10 and the grid 12 are surrounded by a system of electrodes including the inner electrode 14 composed of the discs 15, which are thus perpendicular to the axis of the grid. The electrode 14 is provided with the collar 16 surrounding and supported by the pedestal 9, a lead-in wire 17 being connected to said collar.

A fourth electrode is provided, which comprises an annular plate 18, supported by arms 19 fixedly secured to a ring 20 surrounding and supported by the pedestal 9a. A lead-in wire 21 is connected to the ring 20. It will be understood that the electrode 18 is in the nature of a cylinder whose axis is coincident with the axis of the device and substantially at right angles to the plates or discs 15.

The envelope 5 should be exhausted to such a degree of vacuum that no appreciable current is carried by gaseous ions when the required potentials are applied to the device.

If the cathode 10 is connected to earth and heated to incandescence a positive potential is applied to the grid 12 and there will be a flow of electrons from the cathode 10 to the grid 12. Some of these electrons will pass through the openings of the grid and move or flow in a stream substantially parallel and between the plates 15 of the electrode 14. Their velocity upon reaching the zone between the plates 15 of the electrode 14 will be determined by the potential of that electrode with respect to the cathode. Thus, the stream of electrons will flow between the surfaces of the discs 15 at a velocity determined by the potential of said electrode. If the potential of the electrode is low, the electrons will move slowly and will be greatly influenced by their mutual repulsion, that is, they will spread toward the surfaces 15 so that practically all of the electrons will be received upon the surfaces of electrode 14. On the other hand, if the potential is high, the velocity of the electrons will be high, and the time required for their passage between the discs will be relatively short, hence they will have very little opportunity to spread. Consequently, most of them will pass through in their flow and reach the anode 18.

It is the mutual repulsion of the electrons, since they all possess a definite negative charge, together with curvature of the electrostatic lines of force which terminate at the inner edges of the discs 15 which cause the electrons to spread towards the surfaces of the discs. The magnitude of this spreading and consequently the magnitude of the current received by the electrode 14 is an inverse function of the component of velocity, parallel to the surfaces of the discs, which the electrons possess by virtue of the positive potential applied to the electrode 14 with respect to the cathode.

Thus, the current received by electrode 14 varies inversely with the potential applied to it and it is obvious from the nature of this process that form of the resulting negative resistance characteristic as well as its operating range, from the quantitative standpoint, depend entirely upon the size and space relations of the conducting surfaces which comprise the electrode 14.

This is a highly important feature of the invention since, because of this condition, it is possible for the first time, to control the value of a negative resistance as well as its operating limits and, thus, to design this highly useful electrical factor to meet the various requirements of its many applications.

As described above, it is clear that the operation of the device depends upon the action of electrode 14 upon an electron stream which is directed toward it, and into the extended channels formed by the spaced plates 15 which comprise it. It is also clear that in order for the device to be operative the volume of this electron stream or the number of electrons flowing per unit time from its source at the cathode must be substantially constant over the working range of the device. Obviously if the rate of flow of electrons from the source increased as the potential of the electrode 14 increased, additional electrons would be received by the discs 15, and if this increase were equal to or greater than the decrease in the number of electrons received by the discs due to the action described above, the desired inverse characteristic would be entirely cancelled.

The desired constant current electron stream may be obtained by several methods. For example, in the expression of the invention shown in Figure 1, I have employed the grid 12 placed close to the electron emitting cathode and maintained at a constant positive potential. The value of this potential determines the rate of flow of electrons through the openings of the grid 12 and in this manner a relatively constant flow or stream of electrons is caused to flow toward the electrode 14.

Thus, as the potential of electrode 14 is varied over its working range this fixed or constant current is divided between electrodes 14 and 18 in accordance with the desired operation of the device.

Figure 2:
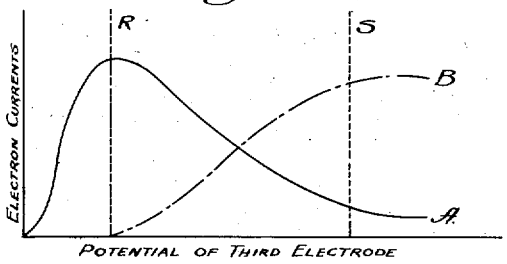
Figure 2 is a diagram illustrating the current characteristics of one of the devices of this invention.

This is clearly shown in Figure 2 in which the curve A represents the portion of the current which is received by electrode 14 and curve B that which passes through the openings of electrode 14 and is received by the anode 18 over the working range of the device indicated by R and S. It will be seen that the total current or the sum of the currents on the A and B curves for all potentials between "R" and "S" is substantially constant. This condition of constant total current is necessary to the proper operation of the device and is what is meant by the terms constant volume electron stream, and saturated, or constant current source of electron.

It has already been pointed out that the magnitude of the current of electricity flowing from the electrode 14 is an inverse function of the velocity of the stream of electrons which enters the space between the discs or surfaces 15 of the electrode 14 provided the anode 18 is maintained at some suitable positive potential. This is, as has also been pointed out, because at high velocities the time required for the individual electrons to pass between the discs is small and their displacement toward the discs is therefore small, whereas, at low velocities their time between the discs is sufficiently long to permit a large portion of them to migrate to the discs. Thus, when the potential of the electrode 14 is high the current to it is small, and the current to the anode 18 is large, and when the potential of the electrode 14 is low the current to it is large and that to the anode 18 is small.

These characteristics can best be understood by again referring to the curves shown in Figure 2 in which the ordinates represent electron currents to the electrode 14 and anode 18 and the abscissae represent the potential of electrode 14. Curve A represents the current-potential characteristic of the electrode 14 and curve B represents the corresponding variations in current to the anode 18 when the potential of the electrode 14 alone is varied, the potential of the anode 18 being fixed at some suitable positive value. The portion of the curves between the limits R and S indicates the useful or operating range of the device. Between these limits the slope of the current-potential characteristic of the electrode 14 is negative and the slope of the corresponding current characteristic of the anode 18 is positive but substantially equal in value to that of the electrode 14. Thus, the electrode 14 provides negative resistance and the anode 18 provides a source of current variations equal in amplitude to variations which occur in the circuit of the electrode 14 without appreciably loading said circuit.

Figure 3:
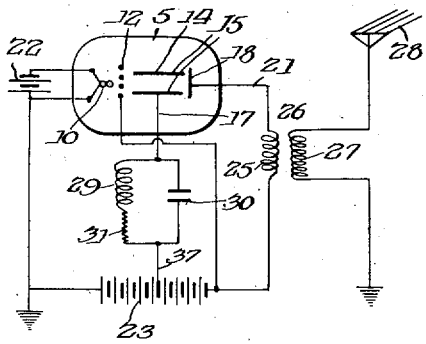
Figure 3 is a diagrammatic view of an electrical circuit incorporating the features of this invention.

In Figure 3 I have illustrated a system in which a negative resistance device such as I have described above may be used to generate alternating currents of any desired frequency from a source of direct current. The electron discharge device 5 is constructed as shown in Figure 1. A battery 22 provides current for heating the filamentary cathode 10, and a battery 23 is employed to impress a constant positive potential upon the grid 12. The anode 18 is also connected to battery 23 through the primary winding 25 of a transformer 26. The secondary winding 27 of said transformer is included in some work circuit such as the antenna 28 of a radio transmitting system.

The circuit connecting the electrode 14 to the cathode 10 includes a suitable portion of battery 23 and a resonant circuit consisting of inductance 29, capacitance 30, and resistance 31. The point 37 at which the electrode 14 is connected to battery 23 is so selected that the positive potential impressed upon the electrode 14 lies within the operating range of the device, that is, between the limits R and S shown in Figure 2. If the value of the negative resistance in the circuit of electrode 14, as determined by the slope of its current-potential characteristic, is less than the equivalent parallel resistance of the resonant circuit, oscillations or pulsating currents will be generated in this circuit. Current, variations of similar amplitude occur in the circuit which includes anode 18 as described above and thus, energy is supplied in the form of alternating currents to the work circuits.

The frequency of the oscillations generated is determined entirely by the constants of the resonant circuit which is associated with the electrode 14. Variations in the nature of the work circuit have very little effect upon the generated frequency.

Since my device depends for its operation only upon the geometry of the electrodes comprising it and upon the fundamental properties of an electron stream, its characteristics can be varied to meet the requirements of specific applications by properly designing the form of the electrode 14. In this respect my device offers distinct advantages over previously employed negative resistance devices based upon gas ionization or secondary emission effects, which have been found to be somewhat erratic in their operation and critical as to operating potentials.

Having thus described my invention and illustrated its use, what I claim as new and desire to secure by Letters Patent is:

1. In a device for producing alternating currents, in combination, a valving device comprising a highly evacuated receptacle, an electron emitting cathode therein, a grid adjacent to said cathode, said cathode and grid being connected to a source of difference of potential, an electrode in said receptacle comprising spaced plates lying adjacent to the path of electron emission from said cathode, said electrode being connected through a resonant circuit to a portion of said source of difference of potential so as to be at positive potential with respect to said cathode, and an anode in said receptacle connected to a portion of said source of potential of greater positive potential than that impressed on said electrode and forming part of an external work circuit, electrons emitted from said cathode passing between the plates of said electrode in their path to the anode, whereby the current flow between said electrode and cathode is varied inversely with the velocity of the electrons.

2. In a device of the character described, in combination, a thermionic device comprising a highly evacuated envelop, an electron emitting cathode in said envelop, a grid adjacent to said cathode, and an anode in said envelop, a negative resistance element interposed between the grid and said anode and comprising a plurality of substantially parallel inter-connected spaced metal plates lying parallel to the electron stream from said cathode to said anode, and means for impressing positive potentials on said grid, anode and element with respect to said cathode such that the portion of the electron stream intercepted by said parallel plates varies inversely with the potential applied thereto over the working range of the device.

3. A negative resistance device comprising a constant source of electrons, an anode, and an electrode comprising a plurality of inter-connected, spaced, conducting plates extending between cathode and anode in and substantially parallel to the stream of electrons which flows from the cathode toward the anode, said anode and electrode being connected to sources of positive potential with respect to the cathode such that the current received by the electrode increases and decreases inversely with the potential applied to the said electrode over the working range of the device.

4. A negative resistance device comprising a constant current source of electrons, an anode, and an electrode interposed therebetween consisting of a plurality of conducting surfaces extending in a direction which is substantially parallel to the flow of electrons from the source to the anode, all enclosed in a highly evacuated envelope, said electrode and anode being connected to sources of positive potential with respect to the said source of electrons, such that the portion of the electron flow intercepted by the said electrode varies inversely with the potential applied thereto over the working range of the device.

5. A negative resistance device comprising a constant volume source of electrons, an electrode comprising a plurality of inter-connected, spaced, conducting plates the surfaces of which extend between the cathode and anode in a direction which is substantially parallel to the path of electrons moving from cathode to anode, said electrode and anode being connected to sources of positive potential with respect to the cathode such that the portion of the electron flow received by the electrode increases and decreases inversely with the potential applied thereto over the working range of the device.

6. A negative resistance device, an electron emitting cathode, means for maintaining the electron emission from the said cathode at a substantially constant value over the working range of the device, an anode and a negative resistance element comprising a plurality of interconnected, spaced, conducting plates the surfaces of which extend between the said cathode and anode in a direction which is substantially parallel to the electron flow from cathode to anode, all enclosed in a highly evacuated envelop, and means for applying positive potentials to said element and anode with respect to the cathode, such that the portion of the electron flow intercepted by the said element varies inversely with the potential applied thereto over the working range of the device.

7. In a device for producing alternating currents, in combination, a valving device comprising a highly evacuated envelope, a constant source of electrons, an anode and a negative resistance element interposed between said source and said anode and comprising a plurality of interconnected, spaced, conducting plates the surfaces of which lie substantially parallel to the flow of electrons from the source to the anode, said negative resistance electrode being connected through a resonant circuit to a source of potential which is positive with respect to the electron emitting cathode and a work circuit being connected between the anode and its source of potential which is also positive with respect to the cathode, such that the oscillations generated in the circuit associated with the negative resistance element cause current variations to occur in the work circuit associated with the anode.

EDWARD H. YONKERS, JR.